United States Patent
Rizzo et al.

(10) Patent No.: US 8,111,140 B2
(45) Date of Patent: Feb. 7, 2012

(54) TRANSPONDER LOAD MODULATION

(75) Inventors: Pierre Rizzo, Aix en Provence (FR); Christophe Moreaux, Eguilles (FR)

(73) Assignee: STMicroelectronics SA, Montrouge (FR)

( * ) Notice: Subject to any disclaimer, the term of this patent is extended or adjusted under 35 U.S.C. 154(b) by 1600 days.

(21) Appl. No.: 11/130,478

(22) Filed: May 16, 2005

(65) Prior Publication Data

US 2005/0254594 A1 Nov. 17, 2005

(30) Foreign Application Priority Data

May 14, 2004 (FR) ..................................... 04 50950

(51) Int. Cl.
*H04Q 5/00* (2006.01)
*G06K 19/077* (2006.01)

(52) U.S. Cl. .................. 340/10.4; 340/10.1; 340/10.34; 340/572.1; 375/238

(58) Field of Classification Search ................. 340/10.4, 340/10.34, 10.1, 572.1; 375/238, 295, 315; 332/106, 109; 363/21.1, 21.11, 21.18, 26, 363/41; 327/62, 67; 455/45, 106, 107, 127.5
See application file for complete search history.

(56) References Cited

U.S. PATENT DOCUMENTS

| | | | | | |
|---|---|---|---|---|---|
| 3,943,446 | A | * | 3/1976 | Quidort | 375/238 |
| 5,260,701 | A | * | 11/1993 | Guern et al. | 340/10.34 |
| 5,828,703 | A | * | 10/1998 | Kanda | 375/316 |
| 6,122,492 | A | | 9/2000 | Sears | |
| 6,281,668 | B1 | * | 8/2001 | Sudo | 323/299 |
| 6,433,502 | B2 | * | 8/2002 | Oku | 318/599 |
| 6,775,323 | B1 | | 8/2004 | Vasudevan Pillai et al. | 375/238 |
| 2002/0000916 | A1 | * | 1/2002 | Richards | 340/572.1 |
| 2002/0022454 | A1 | * | 2/2002 | Serra et al. | 455/41 |
| 2004/0227619 | A1 | * | 11/2004 | Watanabe | 340/10.34 |

FOREIGN PATENT DOCUMENTS

| | | |
|---|---|---|
| EP | 0568067 | 11/1993 |
| JP | 11015934 | 1/1999 |
| WO | 0108088 | 2/2001 |

OTHER PUBLICATIONS

French Search Report Dated Dec. 1, 2004, for French Patent Application No. 04/50950 Filed May 14, 2004, 2 pages.

* cited by examiner

*Primary Examiner* — Edwin Holloway, III
(74) *Attorney, Agent, or Firm* — Lisa K. Jorgenson; Kevin D. Jablonski; Graybeal Jackson LLP

(57) ABSTRACT

An electromagnetic transponder and a method for controlling by pulse trains a switch for modulating the load of this transponder in an electromagnetic field from which it extracts its power supply, the duty ratio of the pulses being controlled according to the transponder supply voltage.

17 Claims, 4 Drawing Sheets

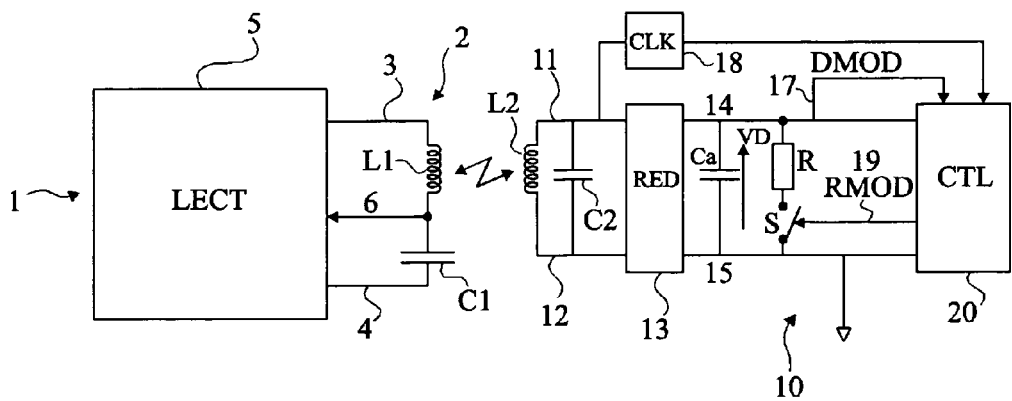
Fig 1 (Prior Art)
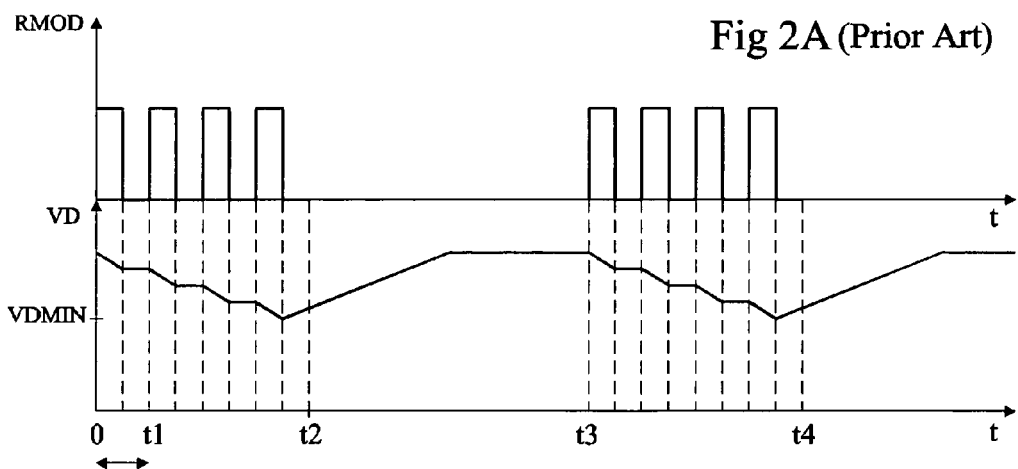
Fig 2A (Prior Art)
Fig 2B (Prior Art)

TRANSPONDER LOAD MODULATION

PRIORITY CLAIM

The present application claims the benefit of French Patent Application No. 04/50950, filed May 14, 2004, which application is incorporated herein by reference in its entirety.

TECHNICAL FIELD

Embodiments of the present disclosure relate generally to the field of transponders, and more specifically to contactless smart cards and labels, intended to communicate with a read/write terminal by radio frequency data transmission.

Embodiments of the present disclosure more specifically apply to remotely-supplied transponders which extract the power necessary to their operation from the electromagnetic field radiated by the terminal close to which they are located.

BACKGROUND

FIG. 1 shows, in the form of blocks, an electromagnetic transponder read terminal and a transponder which communicates with this terminal.

On the read terminal side are generally found a series oscillating circuit 2 formed of an inductance L1 forming an antenna in series with a capacitor C1 coupled between an output terminal 3 of an amplifier or antenna coupler (not shown) and a reference terminal 4 (generally, the ground). Generally, a resistor (not shown) is interposed between the antenna coupler output and inductance L1. The antenna coupler belongs to one or several circuits 5 (LECT) for controlling the oscillating circuit and exploiting received data and comprises, among others, a modulator-demodulator and a microprocessor for processing the control and data signals. In the example of FIG. 1, a node 6 of interconnection between capacitor C1 and inductance L1 forms a terminal for sampling the data signal received from transponder 10, intended for the demodulator of terminal 1.

Circuit 5 of the terminal generally communicates with different input-output circuits (keyboard, screen, means of transmission to a central server, etc.) and/or processing circuits not shown. The circuits of read/write terminal 1 extract the power necessary to their operation from a supply circuit (not shown) coupled, for example, to the electric system or to a battery.

On the side of transponder 10, an inductance L2, in parallel with a capacitor C2, forms a parallel oscillating circuit (called a resonant circuit) intended to sense the electromagnetic field generated by the series oscillating circuit (L1, C1) of terminal 1. The resonant circuit (L2, C2) of transponder 10 is tuned to the resonance frequency of oscillating circuit L1C1 of terminal 1. Parallel resonant circuit L2C2 is intended to capture the electromagnetic field generated by series oscillating circuit L1C1 of terminal 1.

Terminals 11, 12 of resonant circuit L2C2, corresponding to the terminals of capacitor C2, are coupled to two A.C. input terminals of a rectifying circuit 13 (RED) formed, for example, of a bridge (not shown) of four diodes for a fullwave rectification. It should be noted that circuit 13 may be replaced with a halfwave rectifying assembly. A capacitor Ca is coupled to the rectified output terminals 14 and 15 of circuit 13 to store the power and smooth the rectified output voltage.

When transponder 10 enters the electromagnetic field of terminal 1, a high-frequency voltage is generated across resonant circuit L2C2. This voltage, rectified by circuit 13 and smoothed by capacitor Ca, becomes a supply voltage (VD) on terminal 14 intended for electronic circuits 20 of transponder 10. Voltage VD is generally regulated by a voltage regulator (not shown). Circuits 20 (CTL) generally comprise a microprocessor, a memory, and a control circuit. For simplification, reference will be made hereafter to a single circuit 20 containing all these elements. Transponder 10 is generally synchronized by means of a clock (CLK) extracted, by a block 18, from the high-frequency signal recovered across capacitor C2, before rectification. Circuit 20 contains a means for demodulating signals 17 (DMOD) coming from terminal 1 and sampled on terminal 14. To transmit data from transponder 10 to terminal 1, circuit 20 controls a stage of modulation (called back-modulation) of resonant circuit L2C2. This modulation stage is generally formed of an electronic switch S and of a resistor R, in series between terminals 14 and 15. Transistor S is controlled by pulses at a so-called sub-carrier frequency (for example 424 kHz), smaller than the frequency of the excitation signal of oscillating circuit L1C1 of terminal 1 (for example, 13.56 MHz). Circuit 20 provides an output signal 19 (RMOD) of pulse control of switch S. Circuit 20 and the back-modulation stage altogether form a variable load of the transponder, equivalent to a resistor added in parallel on capacitor Ca. This equivalent resistor will be designated hereafter as Req.

When switch S is on, the oscillating circuit of the transponder is submitted to an additional damping with respect to the load formed of circuit 20, so that the transponder samples a greater amount of power from the high-frequency electromagnetic field. Accordingly, the power variation of transponder 10 translates, on the side of terminal 1, as an amplitude and phase variation of the current in antenna L1. This variation is detected in the signal present on node 6 and intended for the demodulator of terminal 1. The oscillating circuits of terminal 1 and of transponder 10 are generally tuned to the carrier frequency, that is, their resonance frequency is tuned to the 13.56-MHz frequency. Generally, all the electronic circuits of transponder 10 are integrated in a same chip.

FIGS. 2A and 2B illustrate, in the form of timing diagrams, a conventional example of the operation of transponder 10 in a data transmission to terminal 1. FIG. 2A shows an example of the shape of control signal RMOD of switch S provided by circuit 20 at a sub-carrier frequency of period (T). In this example, the data are coded by trains of four pulses. Other shapes are possible. Generally, the conduction duty ratio of switch S is set to 0.5.

FIG. 2B illustrates the shape of rectified voltage VD present on terminal 14. Each turning-on of switch S forms an additional charge sampled from the power reserve stored in capacitor Ca. Back-modulation resistor R is selected to cause a power variation of transponder 10 such that the resulting current amplitude and phase variation in antenna L1 is exploitable by circuit 5 of terminal 1. Generally, the internal consumption current of transponder 10 increases as soon as switch S, by its turning-on, reduces equivalent resistance Req by a ratio of from three to six. This current consumption increase causes a decrease in voltage VD.

Conversely, each turning-off of switch S causes an increase in voltage VD until the next turning back on of switch S. In the example of FIG. 2B, the variation ratio of resistance Req and thus of the internal consumption current of the transponder has been selected to be close to three. Thus, voltage VD generally decreases three times faster during on periods of switch S than it increases during its off periods. This weakening of voltage VD is all the more significant as transponder 10 is loosely coupled with terminal 1, that is, when the antennas are distant from each other (by more than sixty centimeters). As a result, the regulator is no longer able to provide a sufficient supply voltage to circuit 10. In FIG. 2B, the minimum threshold of voltage VD short of which regulator "uncouples" and circuit 10 is no longer powered has been designated as VDMIN. In the example of FIG. 2B, it is assumed that voltage VD reaches minimum value VDMIN at the end of a train of four pulses.

A problem which is posed when the oscillating circuits of the transponder and of the terminal are distant is that the power sampled by the back-modulation circuit is such that the transponder supply voltage is decreased to the point that its internal circuits stop operating properly. This results, on the one hand, in stopping the data transmission from the transponder to the terminal and, on the other hand, in reducing the transponder remote-supply distance.

Another problem is that, to properly demodulate the received signal, a reader which is sufficiently sensitive to operate while voltage VD is close to VDMIN typically must be provided. This results in a risk of demodulator saturation when, conversely, voltage VD is higher, that is, when the transponder is very close to the reader.

SUMMARY

An embodiment of the present disclosure provides a novel solution which overcomes at least some disadvantages of conventional solutions, especially when a transponder is in remote or dose coupling relation with a read/write terminal.

In remote coupling relation, this embodiment reduces the supply voltage decrease effect linked to the distance between the transponder and the read terminal.

In close coupling relation, this embodiment reduces the disturbances of demodulation circuits of the terminal due to the distance between the transponder and the read terminal.

This embodiment also provides a solution which requires few or no structural modification of the transponder.

This embodiment of the present disclosure also provides a method for controlling by pulse trains a switch for modulating the load of a transponder in an electromagnetic field from which it extracts its power supply, the duty ratio of the pulses being controlled according to the transponder supply voltage.

According to an embodiment of the present disclosure, the control is linear.

According to an embodiment of the present disclosure, the control is by degrees.

According to an embodiment of the present disclosure, said supply voltage is compared with at least one minimum voltage.

According to an embodiment of the present disclosure, said supply voltage is compared with at least one maximum voltage.

An embodiment of the present disclosure also provides a transponder comprising a resonant circuit from which it extracts its supply voltage from an electromagnetic circuit radiated by a terminal, a pulse train modulation circuit having at least one switch modulating the load that it forms on the electromagnetic field, and means for controlling the duty ratio of the pulses according to said supply voltage.

According to an embodiment of the present disclosure, the control means are linear.

According to an embodiment of the present disclosure, the control means are digital.

According to an embodiment of the present disclosure, the duty ratio is conditioned by a comparison of said supply voltage with a minimum voltage.

According to an embodiment of the present disclosure, the duty ratio is conditioned by a comparison of said supply voltage with a maximum voltage.

BRIEF DESCRIPTION OF THE DRAWINGS

Features and advantages of the present disclosure will be discussed in detail in the following non-limiting description of specific embodiments in connection with the accompanying drawings.

FIGS. 1, 2A, and 2B, previously described, are intended to show the state of the art and the problem to solve;

DETAILED DESCRIPTION

Figure 3:
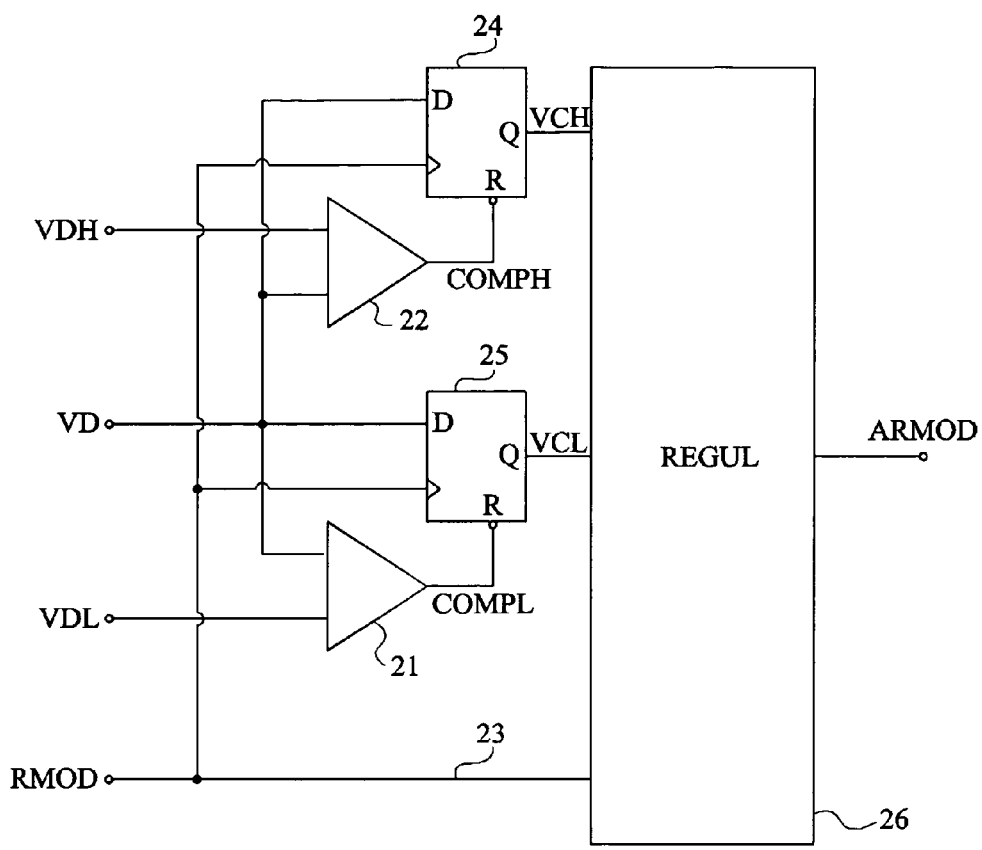
FIG. 3 shows in the form of blocks a first embodiment of the switch control method according to the present disclosure.
Figure 4:
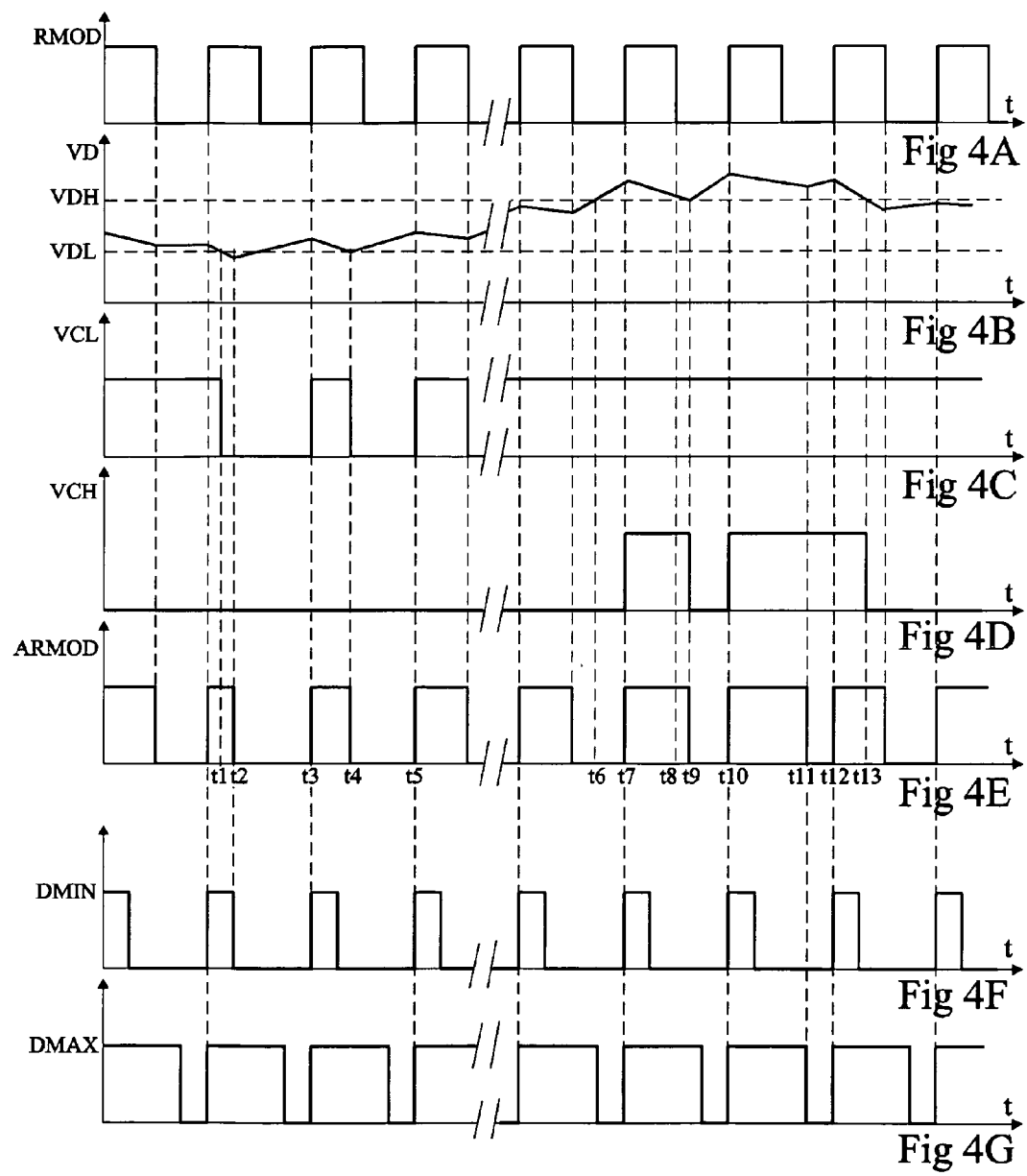
FIGS. 4A to 4G illustrate in the form of timing diagrams the operation of the transponder of FIG. 3 according to an embodiment of the disclosure.

Same elements have been designated with same reference numerals in the different drawings. For clarity, only those elements which are necessary to the understanding of embodiments of the present disclosure have been shown in the drawings and will be described hereafter. In particular, the digital electronic circuits have not been detailed on the reader side.

A feature of an embodiment of the present disclosure is to control the duty ratio of the control pulses of a transponder modulation circuit with the power supply thereof.

The duty ratio is obtained from a comparison of the supply voltage with at least one threshold.

FIG. 3 schematically shows an embodiment of a circuit for controlling the control signal of a back-modulation switch implementing the pulse train control method according to the present disclosure. For simplification, the rest of the transponder circuits have not been shown, and may be conventional.

In this example, a pulse train RMOD provided by control circuit 20 (FIG. 1) is applied on a first input 23 of a circuit 26 (REGUL) for controlling the conduction of switch S (FIG. 1). Circuit 26, which is in practice comprised in circuit 20, provides a signal ARMOD. Generally, the duty ratio of signal RMOD is set to 0.5.

Supply voltage VD of circuit 20 is applied to first respective input terminals of a comparator 21 and of a comparator 22. Pulse train RMOD is applied on synchronization inputs of D-type flip-flops 24 and 25. The outputs of flip-fops 24 and 25 form inputs, respectively VCH and VCL, of circuit 26. Outputs COMPL and COMPH of comparators 21 and 22 are applied on inverting reset inputs R, respectively of flip-fops 25 and 24. Voltage VD is applied to each of load inputs D of flip-flops 24 and 25. On each rising edge of signal RMOD, voltage VD is charged respectively on outputs VCH and VCL and on first input terminals of comparators 22 and 21.

A first so-called "low" limit voltage reference VDL and a second so-called "high" limit reference voltage VDH are respectively applied to the second input terminals of comparators 21 and 22. Low voltage limit VDL is selected to be greater than minimum operation voltage VDMIN of transponder 10. High limit VDH corresponds to a threshold from which the back-modulation level disturbs (saturates) the demodulation circuits of terminal 1, on reading of the data transmitted by transponder 10. A low level of signal COMPL causes the reset of flip-flop 25. Similarly, a low level of signal COMPH causes the reset of flip-flop 24.

Circuit 26 outputs a signal (ARMOD) for controlling switch S, having a conduction duty ratio controlled according to voltage VD. Preferably, signal ARMOD is active in the high state and controls the gate of switch S (generally, a MOS-type transistor).

As soon as voltage VD reaches one of the two low or high limits VDL or VDH, signals VCL or VCH provided by flip-flops 25 or 24 to circuit 26 cause, respectively, a reduction or an increase in the duty ratio of signal RMOD. At the output of circuit 26, the duty ratio of signal ARMOD is either reduced under, or increased above, its nominal operation value, that is, without crossing limits VDL or VDH. As a result, the turning-off of switch S is either advanced in case low limit VDL has been crossed, or delayed in case high limit VDH has been crossed.

The variation range of the duty ratio is limited by two high and low thresholds. The low threshold is selected according to the conduction threshold of switch S short of which reader 1 can no longer correctly demodulate the data transmitted by transponder 10. Generally, this low threshold is selected from a duty ratio range from 0.1 to 0.4. Symmetrically, the high threshold is selected according to the high conduction threshold of switch S beyond which reader 1 can no longer correctly demodulate the data transmitted by transponder 10. Typically, this high threshold is selected from a duty ratio range from 0.6 to 0.9.

FIGS. 4A to 4G illustrate, in the form of timing diagrams, an example of the shape of characteristic signals at different points of the embodiment described in FIG. 3. FIGS. 4A to 4E respectively show the signals of modulation RMOD, of voltage VD, of low and high comparison VCL and VCH, and of control signal ARMOD of switch S. These timing diagrams show, in their left-hand portion, a control of the conduction duty ratio of switch S resulting from a crossing of low limit VDL, and right-hand portion, a control resulting from a crossing of high limit VDH.

For a nominal operation with no crossing of one of limits VDL or VDH, the duty ratio of signal RMOD has been set to 0.5. As an example, thresholds DMIN and DMAX limiting the duty ratio range by minimum and maximum pulse durations have been respectively set to 0.25 and 0.75. These thresholds have been illustrated by two additional timing diagrams (FIGS. 4F and 4G) which are here for reasons of explanation only. In practice, the application of these thresholds requires no generation of specific pulse patterns, although, as discussed below in conjunction with FIG. 5, such patterns may be generated.

In an operation with a crossing of low limit VDL, assume that at a time t1 during a conduction phase of switch S, voltage VD reaches low limit VDL. At this time t1, output VCL of flip-flop 25 switches to a low state. Assuming that time t1 is under the minimum duration of a pulse, circuit 26 maintains signal ARMOD high. At a time t2, corresponding to the end of the minimum duration of a pulse, signal ARMOD switches and controls the turning off of switch S. The turning-off of switch S at time t2 reduces the transponder consumption, causing an increase in voltage VD until a time t3. Time t3 corresponds to the next turning-on of switch S triggered by circuit 26 at the rising edge of input signal RMOD. It is assumed that at a time t4, voltage VD reaches low limit VDL again, causing the premature turning-off of switch S. Here, time t4 is subsequent to the minimum duration of a pulse set by threshold DMIN, which explains the immediate switching of signal ARMOD. From a time t5 corresponding to the next turning-on, switch S is turned back on. Here, threshold VDL is not crossed. The duty ratio of signal ARMOD is thus at its nominal operation value (0.5 in this example).

It can be seen that the duty ratio of signal ARMOD is linearly controlled by circuit 26 as soon as voltage VD is smaller than VDL, while remaining limited to minimum threshold DMIN of the conduction duty cycle.

In an operation with a crossing of high limit VDH, assume that at a time t6 during an off phase of switch S, voltage VD reaches high limit VDH. At this time t6, output VCH of flip-flop 24 switches to a high state. Time t7 corresponds to the next turning-on of switch S triggered by circuit 26 at the rising edge of input signal RMOD. The nominal duration of the pulse started at time t7 of signal RMOD ends at a time t8. The turning-on of switch S at time t7 increases the transponder consumption, causing a decrease in voltage VD until a time t9 for which it is assumed that voltage VD is again greater than high limit VDH. Since time t9 is prior to the maximum duration of a pulse set by threshold DMAX, the switching to the low state of signal ARMOD and the turning-off of switch S are immediate. From a time t10 corresponding to the next turning-on, switch S is turned back on. The turning-on of switch S at time t10 increases the transponder consumption, causing a decrease in voltage VD until a time t11 for which it is assumed that voltage VD is greater than high limit VDH. Here, time t11 corresponds to the maximum duration of a pulse set by threshold DMAX, which explains the immediate switching of signal ARMOD. At a time t12 corresponding to the next rising edge of input signal RMOD, the turning-on of switch S is triggered by circuit 26. It is assumed that at a time t13, voltage VD reaches and falls under high limit VDH, causing the switching to the low state of voltage VCH. Assuming that time t13 is within the minimum duration of a pulse, circuit 26 maintains signal ARMOD high until the end of the nominal duration of pulse RMOD. The duty ratio of signal ARMOD thus is at its nominal operation value (0.5 in this example).

It can be seen that the duty ratio of signal ARMOD is linearly controlled by circuit 26 on voltage VD as soon as it is greater than VDH, while remaining limited to maximum threshold DMAX of the conduction duty ratio.

Figure 5:
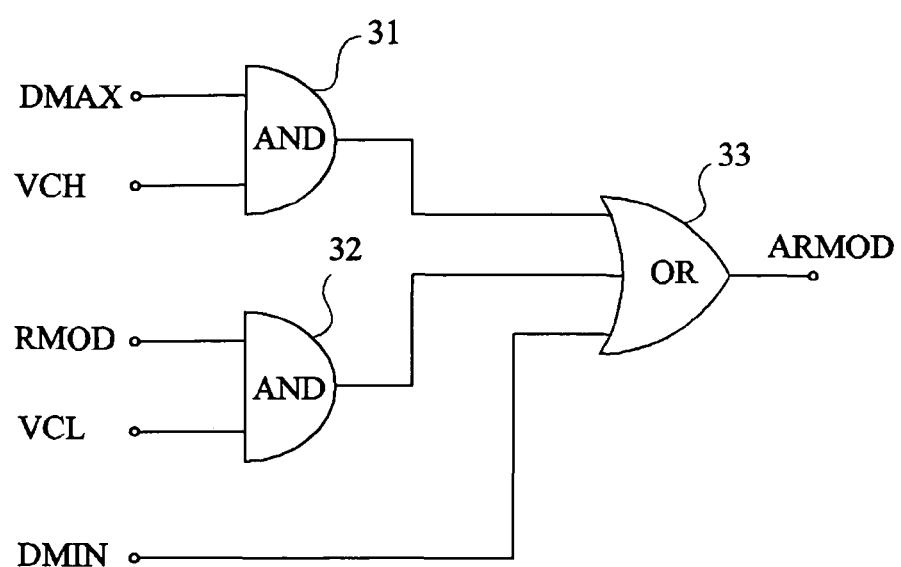
FIG. 5 shows in the form of logic gates an embodiment of the control function of the switch control according to the present disclosure.

FIG. 5 shows, in the form of logic gates, an embodiment of control circuit 26 (FIG. 3) of signal RMOD. A first AND-type gate 31 receives on its two inputs signals DMAX and VCH. A second gate 32, also of type AND, receives on its two inputs signals RMOD and VCL. Signal DMIN and the output signals of gates 31 and 32 are applied on three inputs of an OR-type gate 33. The output of gate 33 corresponds to control signal ARMOD of circuit 26 of FIG. 3.

A digital embodiment in which the control means are formed by duty ratio stages may also be provided. These stages are organized in the form of a table stored in a non-volatile memory (not shown) of transponder 10 of FIG. 1. At its input, the table is formed of stages limited by a low and high value of voltage VD. Each high terminal of a stage corresponds to the low terminal of the stage directly above in terms of voltage VD. The low and high terminals of the stages located at the ends of the excursion range of voltage VD respectively correspond to voltages VDL and VDH of the first embodiment described in FIG. 3. In practice, it is assumed that voltage VD is first measured in analog form, then converted in digital form by any known analog-to-digital conversion means. At its output, the table provides a constant duty ratio for all the voltages VD ranging between the low and high terminals of a same stage. The duty ratios of the extreme stages of the excursion range of voltage VD respectively correspond to minimum and maximum thresholds DMIN and DMAX of the first embodiment described in FIG. 3. The resolution of the control depends on the number of stages selected to cover the excursion range of voltage VD, and on the granularity with which the digital conversion of analog signal VD is performed.

An advantage of an embodiment of the present disclosure is that it reduces the power sampled by the back-modulation circuit of the transponder in remote coupling relation. This results in increasing the remote-supply distance.

Another advantage is an improvement in the demodulation by the terminal for reading the data transmitted by the transponder, both in remote coupling and in close coupling. An embodiment of the present disclosure enables increasing the sensitivity of the reader in remote coupling while strongly reducing the saturation risk of the reader's demodulator in close coupling.

Although embodiments of the present disclosure has been described in relation with the supply voltage, embodiments may be provided to control the duty ratio according to any other information or signal linked to this supply voltage.

Of course, the present disclosure is likely to have various alterations, modifications, and improvements which will readily occur to those skilled in the art. In particular, the sizing of the low and high limits of the transponder supply voltage, as well as of the minimum and maximum duty ratio thresholds, depends on the application and, in particular, on the frequency of the different carriers and on the system range.

Such alterations, modifications, and improvements are intended to be part of this disclosure, and are intended to be within the spirit and the scope of the present disclosure. Accordingly, the foregoing description is by way of example only and is not intended to be limiting.

The invention claimed is:

1. A method, comprising:
controlling, by pulse trains, a switch for modulating the load of a transponder in an electromagnetic field from which it extracts its power supply,
wherein the duty ratio of the pulses that are controlling the switch is controlled according to the transponder supply voltage, such that the duty ratio decreases to a non-zero value if the transponder supply voltage falls below a first threshold voltage and increases if the transponder supply voltage rises above a second voltage threshold that is higher than the first voltage threshold.

2. The method of claim 1, wherein the control is linear.

3. The method of claim 1, wherein the control is incremental.

4. The method of claim 1, wherein said supply voltage is compared with at least one minimum voltage.

5. The method of claim 1, wherein said supply voltage is compared with at least one maximum voltage.

6. A transponder comprising:
a resonant circuit from which the transponder extracts its supply voltage from an electromagnetic field radiated by a terminal of an electromagnetic circuit,
a pulse train modulation circuit having at least one switch for modulating a load on the electromagnetic field of the electromagnetic circuit, and
a controller for controlling the duty ratio of the pulses according to said supply voltage, such that the duty ratio decreases to a non-zero value if the transponder supply voltage falls below a first threshold voltage and increases if the transponder supply voltage rises above a second voltage threshold that is higher than the first voltage threshold.

7. The transponder of claim 6, wherein the controller comprises a linear controller.

8. The transponder of claim 6, wherein the controller comprises a digital controller.

9. The transponder of claim 6, wherein the duty ratio is conditioned by a comparison of said supply voltage with a minimum voltage.

10. The method of claim 6, wherein the duty ratio is conditioned by a comparison of said supply voltage with a maximum voltage.

11. A transmitter, comprising:
a data circuit operable to generate a raw data pulse; and
a regulator circuit coupled to the data circuit and operable to generate from the raw data pulse a transmission data pulse having a duty cycle that is related to a supply voltage;
wherein the regulator circuit further comprises:
a comparison circuit operable to compare the supply voltage to a low threshold and to a high threshold that is greater than the low threshold, to generate a first comparison signal having a first level if the supply voltage is less than the low threshold and having a second level if the supply voltage is greater than the low threshold, and to generate a second comparison signal having the first level if the supply voltage is less than the high threshold and having the second level if the supply voltage is greater than the high threshold;
a generator operable to generate a first reference signal having a predetermined minimum duty cycle and a second reference signal having a predetermined maximum duty cycle;
a first AND gate operable to receive the first comparison signal and the raw data signal;
a second AND gate operable to receive the second comparison signal and the second reference signal; and
an OR gate operable to receive the first reference signal and respective output signals from the first and second AND gates and to generate the transmission data pulse.

12. The transmitter of claim 11, wherein the data circuit is operable to generate the raw data pulse having a duty cycle of substantially 50%.

13. The transmitter of claim 11, further comprising:
first and second supply nodes across which the supply voltage appears; and
a switch coupled across the supply nodes and operable to open and close in response to the transmission data pulse.

14. The transmitter of claim 11, further comprising:
first and second supply nodes;
a power supply operable to generate the supply voltage across the first and second supply nodes; and
a switch coupled across the supply nodes and operable to open and close in response to the transmission data pulse.

15. A method, comprising:
determining a level of a supply voltage; and
generating a data pulse having a duty cycle that is related to the level of the supply voltage;
wherein generating the data pulse comprises:
commencing the pulse;
if the supply voltage is below a low threshold at the end of a first predetermined time, then ending the pulse in response to the end of the first predetermined time;
if the supply voltage is above the low threshold at the end of the first predetermined time and falls below the low threshold before the end of a second predetermined time, then ending the pulse in response to the supply voltage falling below the low threshold;

if the supply voltage is above the low threshold at and between the ends of the first and second predetermined times and is below a high threshold at the end of the second predetermined time, then ending the pulse in response to the end of the second predetermined time;

if the supply voltage is above the low threshold at and between the ends of the first and second predetermined times, is above the high threshold at the end of the second predetermined time, and falls below the high threshold before the end of a third predetermined time, then ending the pulse in response to the supply voltage falling below the high threshold; and if the supply voltage is above the low threshold at and between the ends of the first and second predetermined times and is above the high threshold at and between the ends of the second and third predetermined times, then ending the pulse in response to the end of the third predetermined time.

16. The method of claim 15, further comprising transmitting the data pulse.

17. The method of claim 15, further comprising modulating a carrier signal with the data pulse.

* * * * *